United States Patent [19]
Im

[11] Patent Number: 5,805,617
[45] Date of Patent: Sep. 8, 1998

[54] APPARATUS FOR COMPUTING ERROR CORRECTION SYNDROMES

[75] Inventor: Yong-Hee Im, Seoul, Rep. of Korea

[73] Assignee: Daewoo Electronics Co., Ltd., Seoul, Rep. of Korea

[21] Appl. No.: 755,580

[22] Filed: Nov. 25, 1996

[30] Foreign Application Priority Data

| Feb. 28, 1996 | [KR] | Rep. of Korea | 96-5130 |
| Feb. 28, 1996 | [KR] | Rep. of Korea | 96-5132 |
| Feb. 29, 1996 | [KR] | Rep. of Korea | 96-5445 |
| Feb. 29, 1996 | [KR] | Rep. of Korea | 96-5446 |
| Feb. 29, 1996 | [KR] | Rep. of Korea | 96-5447 |

[51] Int. Cl.$^6$ ............................................. H03M 13/00
[52] U.S. Cl. .................................... 371/37.12; 371/37.11
[58] Field of Search .......................... 371/37.12, 37.11

[56] References Cited

U.S. PATENT DOCUMENTS

| 4,649,541 | 3/1987 | Lahmeyer | 371/37 |
| 4,763,332 | 8/1988 | Glover | 371/37 |
| 4,833,678 | 5/1989 | Cohen | 371/37 |
| 4,845,713 | 7/1989 | Zook | 371/37 |
| 5,471,485 | 11/1995 | Tong | 371/37.1 |

FOREIGN PATENT DOCUMENTS 0416513  3/1991  European Pat. Off. .

*Primary Examiner*—Stephen M. Baker
*Attorney, Agent, or Firm*—Pennie & Edmonds LLP

[57] ABSTRACT

A syndrome calculating device, for use in a Reed-Solomon decoder, for calculating syndromes $S_i$'s iteratively, according to:

$$S_i = \{\ldots [(r_{N-1}\alpha^i + r_{N-2})\alpha^i + r_{N-3}]\alpha^i + \ldots + r_1\}\alpha^i + r_0$$

wherein $r_{N-j}$ represents a jth received symbol which is fed in synchronization with a symbol clock and $\alpha^i$ denotes an ith root of a code generating polynomial, comprises a plurality of syndrome calculating cells, each of which including: a memory block containing K registers, wherein the memory block is initialized to 0 prior to a first iteration; a root input block for sequentially providing K roots of the code generating polynomial during each iteration; a multiplier on a finite field GF($2^m$) for sequentially multiplying the K roots of the code generating polynomial with the contents of the K registers, to thereby provide K multiplication results during each iteration; and an adder on the finite field GF($2^m$) for adding $r_{N-j}$ to each of the K multiplication results during a jth iteration, to thereby provide the K intermediate values or the K syndromes.

20 Claims, 6 Drawing Sheets

APPARATUS FOR COMPUTING ERROR CORRECTION SYNDROMES

FIELD OF THE INVENTION

The present invention relates to an apparatus for correcting errors present in stored or transmitted data; and, more particularly, to an apparatus for determining syndromes which are used in correcting errors in the data encoded by using a Reed-Solomon code.

DESCRIPTION OF THE PRIOR ART

Noises occurring during a process of transmitting, storing or retrieving data can in turn cause errors in the transmitted, stored or retrieved data. Accordingly, various encoding techniques, having the capability of rectifying such errors, for encoding the data to be transmitted or stored have been developed.

In such encoding techniques, a set of check bits is appended to a group of message or information bits to form a codeword. The check bits, which are determined by an encoder, are used to detect and correct the errors. In this regard, the encoder essentially treats the bits comprising the message bits as coefficients of a binary message polynomial and derives the check bits by multiplying the message polynomial i(X) with a code generating polynomial g(X) or dividing i(X) by g(X), to thereby provide a codeword polynomial c(X). The code generating polynomial is selected to impart desired properties to a codeword upon which it operates so that the codeword will belong to a particular class of error-correcting binary group codes (see, e.g., S. Lin et al., "Error Control Coding: Fundamentals and Applications", Prentice-Hall, 1983).

One class of error correcting codes is the well-known BCH (Bose-Chaudhuri-Hocquenghen) codes, which include the Reed-Solomon codes. The mathematical basis of Reed-Solomon codes is explained in, e.g., the aforementioned reference by Lin et al. and also in Berlekamp, "Algebraic Coding Theory", McGraw-Hill, 1968, which is further referred to in U.S. Pat. No. 4,162,480 issued to Berlekamp.

If roots of the code generating polynomial g(X) of the Reed-Solomon code are 2T consecutive powers of $\alpha$ as in Eq. (1), T being a predetermined positive integer, as many as T errors can be corrected:

$$g(X) = \prod_{i=1}^{2T} (X - \alpha^i) \qquad \text{Eq. (1)}$$

wherein $\alpha$ is a primitive element on a finite field $GF(2^m)$.

In the process of receiving or retrieving a transmitted or stored codeword, certain attendant noises may have been converted to an error pattern in the codeword. In order to deal with the error pattern imposed upon Reed-Solomon codes, a four step procedure is generally utilized. In discussing the error-correcting procedure, reference shall be made to a Reed-Solomon code consisting of codewords containing N m-bit symbols, N and m being positive integers (of which K symbols are informational symbols and (N–K) symbols are check symbols, K being a positive integer not larger than N). In that case, c(X) becomes an (N–1)st order polynomial and 2T equals (N–K). As a first error correcting step, syndromes $S_0, S_1, \ldots, S_{2T-1}$ are calculated from a received codeword polynomial r(X), i.e., an (N–1)st order polynomial representing the received codeword. The received codeword polynomial r(X) is represented as $r_{N-1}X^{N-1}+r_{N-2}X^{N-2}+\ldots+r_1X^1+r_0$, wherein $r_j$ is an (N–j)th received symbol of a codeword. As a second step, using the syndromes, coefficients of an error locator polynomial $\sigma(X)$ are calculated. In a third step, the error locator polynomial $\sigma(X)$ is solved to obtain its roots, which represent the error locations in the received codewords. As a fourth step, using the error locations and the syndromes, error values are calculated. Mathematical expressions for the syndromes and the coefficients of the error locator polynomial are set forth in the afore-referenced U.S. Pat. No. 4,162,480 issued to Berlekamp.

The syndromes $S_0$ to $S_{2T-1}$ are calculated by substituting roots of the code generating polynomial, i.e., $\alpha^0$ to $\alpha^{2T-1}$, for X in the received codeword polynomial r(X), respectively.

Meanwhile, the received codeword r(X) can be represented as an addition of the original codeword polynomial c(X) to an error polynomial e(X), that is:

$$r(X)=c(X)+e(X) \qquad \text{Eq. (2)}$$

As the codeword polynomial c(X) is derived by multiplying the code generating polynomial g(X) and the message polynomial i(X), substituting a root of g(X) for X in the received codeword polynomial r(X) results in 0 if the error polynomial e(X) equals 0. That is, in case of no error, all the syndromes $S^0$ to $S_{2T-1}$ are 0.

Figure 1:
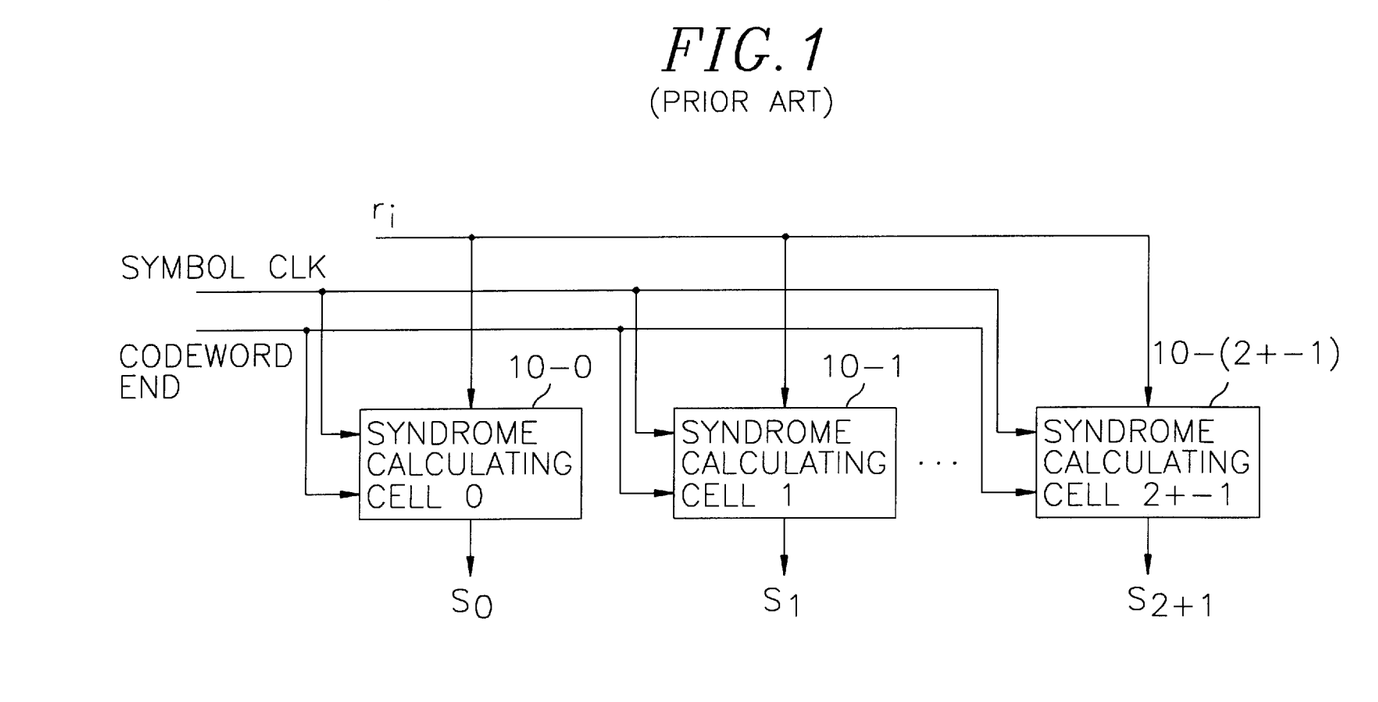
FIG. 1 shows a block diagram of a conventional syndrome calculating device which calculates 2T syndromes.

Referring to FIG. 1, there is shown a block diagram of a conventional syndrome calculating device including 2T syndrome calculating cells (10-0 to 10-(2T-1)), which is disclosed in, e.g., U.S. Pat. No. 4,845,713 issued to Zook.

A received symbol $r_j$, j being 0 to N–1, is coupled to the syndrome calculating cells (10-0 to 10-(2T-1)), each of which determines a syndrome ($S_i$) for each root ($\alpha^i$) of the code generating polynomial g(X).

At the syndrome calculating cells (10-0 to 10-(2T-1)), 2T syndromes ($S_0$ to $S_{2T-1}$) are provided at a time when N symbols, i.e., 1 codeword, are received. The completion of inputting N symbols is notified by a codeword end signal (CODEWORD END) which is fed to each of the syndrome calculating cells. The ith syndrome calculating cell (10-i) provides the ith syndrome $S_i$ by computing the following equation:

$$S_i = \sum_{j=0}^{N-1} r_j(\alpha^i)^j = \qquad \text{Eq. (3A)}$$

$$\{\ldots[(r_{N-1}\alpha^i + r_{N-2})\alpha^i + r_{N-3}]\alpha^i + \ldots + r_1\}\alpha^i + r_0 \qquad \text{Eq. (3B)}$$

wherein $r_j$ represents the received symbol inputted in synchronization with a symbol clock, $r_j$ being an (N–j)th received symbol of a codeword; and the additions and the multiplications are done on the finite field $GF(2^m)$.

Figure 2:
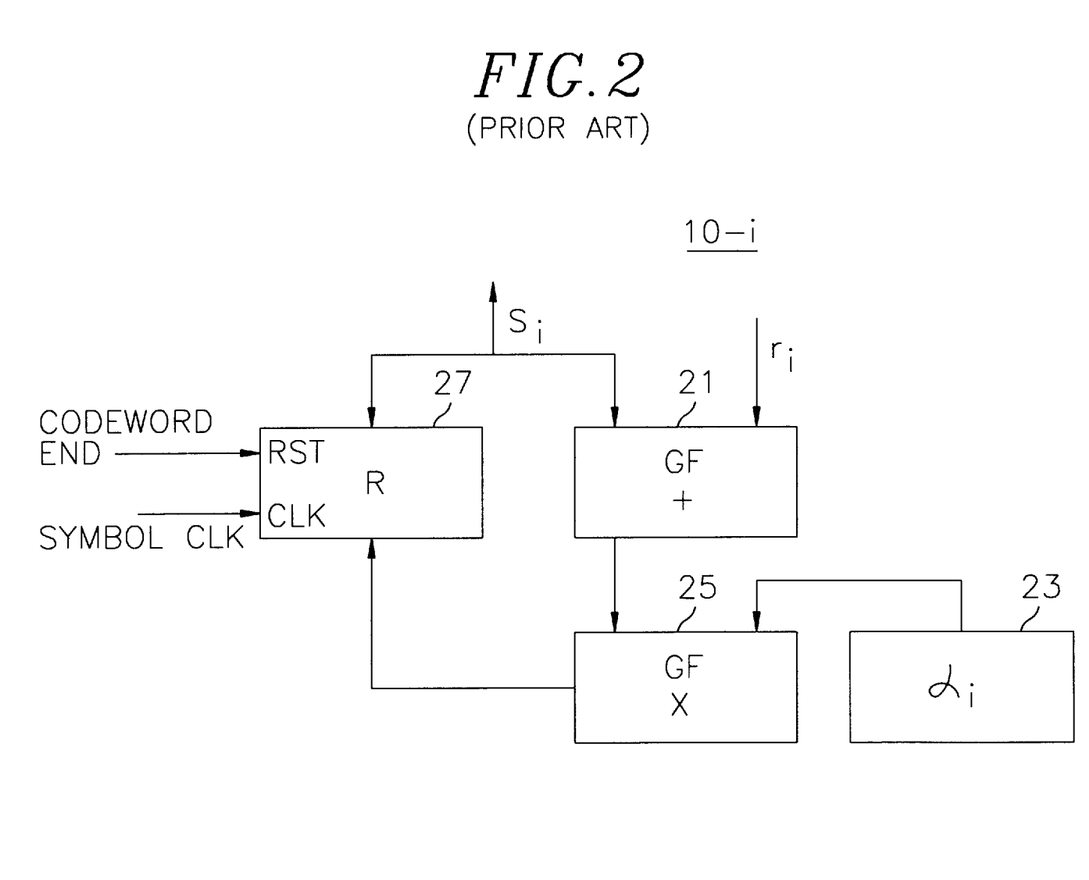
FIG. 2 represents a schematic diagram of a conventional syndrome calculating cell.

Referring to FIG. 2, there is shown a detailed block diagram of an ith syndrome calculating cell 10-i which includes a multiplier 21 operating on the finite field $GF(2^m)$, a memory 23, an adder 25 operating on the finite field $GF(2^m)$, and a register 27. The structures of the 2T syndrome calculating cells are identical except the contents of the memory.

At the syndrome calculating cell, calculation of Eq. (3B) is done iteratively from the innermost parenthesis. To do this, the received symbols ($r_{N-1}$ to $r_0$ in that order) are provided to the GF adder 25 one by one, one symbol per symbol clock cycle.

An intermediate value is stored at the register 27, the intermediate value referring to a result of an iteration in the course of calculating the Eq. (3B), e.g., ($r_{N-1}\alpha^i+r_{N-2}$). Before a first received symbol $r_{N-1}$ of a current codeword is inputted, the register 27 is initialized to an initial intermediate value 0. Specifically, the register 27 is initialized in response to a codeword end signal (CODEWORD END) which notifies the end of a previous codeword.

During a first symbol clock cycle, at the multiplier 21, the initial intermediate value 0 provided from the reigster 27 is multiplied with $\alpha^i$, to thereby provide a multiplication result 0 to the adder 25. The ith root of the code generating polynomial $\alpha^i$ is stored at the memory 23, to be provided to the multiplier 21.

Meanwhile, the first received symbol, $r_{N-1}$ is fed to the GF adder 25 wherein it is added to the multiplication result 0. The result, i.e., $r_{N-1}$, is coupled to the register 27.

At the rising edge of a second symbol clock cycle, an intermediate value obtained in the first symbol clock cycle, i.e., $r_{N-1}$, is clocked into the register 27, to be stored therein.

During the second symbol clock cycle, the intermediate value $r_{N-1}$ provided from the register 27 is fed to the multiplier 21 wherein it is multiplied with $\alpha^i$. The multiplication result, $r_{N-1}\alpha^i$, at this time is fed from the multiplier 21 to the adder 25 wherein it is added to a second received symbol $r_{N-2}$ which is fed to the adder during the second symbol clock cycle, to thereby provide an intermediate value $r_{N-1}\alpha^i+r_{N-2}$. The intermediate value is coupled to the register 27, to be stored therein at the rising edge of a third symbol clock cycle.

By repeating procedures similar to the one explained above, calculation of Eq. (3) is completed in N symbol clock cycles and a syndrome value $S_i$, i.e., $\{\ldots[(r_{N-1}\alpha^i+r_{N-2})\alpha^i+r_{N-3}]\alpha^i+\ldots+r_1\}\alpha^i+r_0$, is provided from the syndrome calculating cell 10-i.

In accordance with the conventional syndrome calculating device explained above, as many as 2T syndrome calculating cells are needed to calculate 2T syndromes. Accordingly, 2T adders and 2T multipliers on the finite field $GF(2^m)$ should be accommodated at the syndrome calculating device. These facts render the structure of the syndrome calculating device highly complicated and, which may in turn make it rather difficult to implement it by using, e.g., VLSI (Very Large Scale Integrating) technology.

SUMMARY OF THE INVENTION

It is, therefore, a primary object of the present invention to provide a syndrome calculating device which is constructed with a reduced number of multipliers and adders on a finite field and operates by using a bit clock instead of a symbol clock, thereby achieving a reduction in processing time as well as the manufacturing cost or complexity of the device.

In accordance with the present invention, there is provided an apparatus, for use in a Reed-Solomon decoder which decodes a codeword containing N received symbols, for calculating syndromes $S_i$'s iteratively in N iterations, according to $$S_i=\{\ldots[(r_{N-1}\alpha^i+r_{N-2})\alpha^i+r_{N-3}]\alpha^i+\ldots+r_1\}\alpha^i+r_0$$

wherein i is an integer ranging from 0 to 2T-1, T being a predetermined number, $r_{N-j}$ represents a jth received symbol which is fed in synchronization with a symbol clock, j being 1 to N, $\alpha^i$ denotes an ith root of a code generating polynomial, the device comprising a plurality of syndrome calculating cells each of which provides K syndromes, K being a positive integer not larger than 2T, each syndrome calculating cell including:

a register block containing a first set of K registers, wherein the register block sequentially provides contents of the first set of K registers during each iteration and is initialized to 0 prior a first iteration;

a root input block for sequentially providing K roots of the code generating polynomial during each iteration;

a multiplier on a finite field $GF(2^m)$ for sequentially multiplying the K roots of the code generating polynomial provided from the root input block with the contents of the first set of T registers provided from the register block, to thereby provide K multiplication results during each iteration; and an adder on the finite field $GF(2^m)$ for adding the jth received symbol $r_{N-j}$ to each of the K multiplication results during each iteration, to thereby provide the K intermediate values to the register block during an (j1)th iteration, j1 being 1 to (N-1), or provide the K syndromes to the register block during an Nth iteration.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 3:
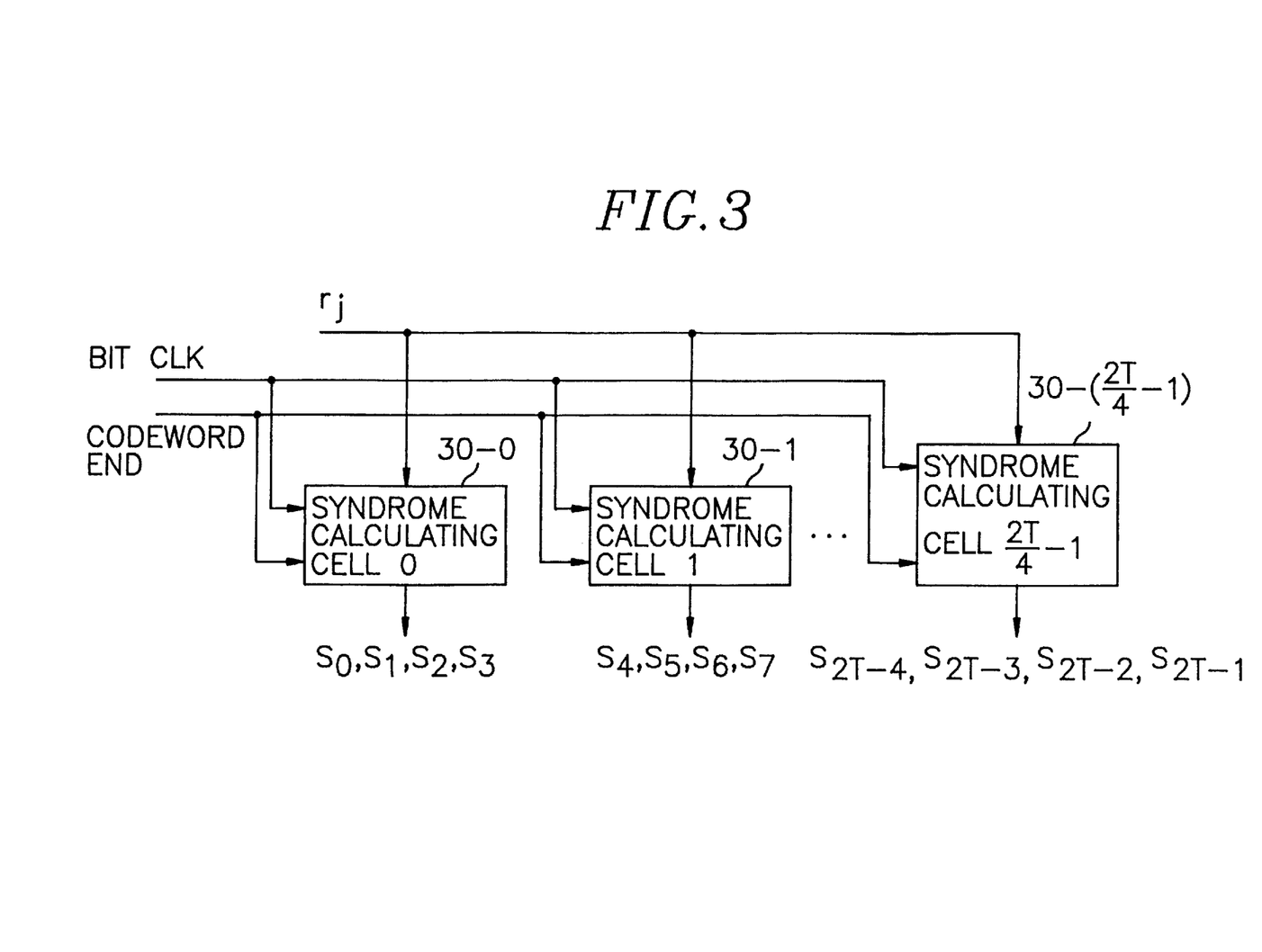
FIG. 3 illustrates a block diagram of a syndrome calculating device in accordance with the present invention.

Referring to FIG. 3, there is provided a block diagram of a syndrome calculating device in accordance with the present invention. Similar to the conventional one, the syndrome calculating device shown in FIG. 3 includes a multiplicity of syndrome calculating cells. However, contrary to the conventional device, a syndrome calculating cell of the present invention calculates K syndromes simultaneously, as specified in FIG. 3, K being a plural number not larger than 2T, T being a predetermined number. In the examples shown in FIGS. 3 to 6, K is set to 4 for the purpose of a simple illustration. Since the syndrome calculating cell 30-i of the present invention can substitute 4 conventional cells, 2T/4 cells are needed to calculate 2T syndromes as shown in FIG. 3.

It is also noted that a bit clock is fed to each of the syndrome calculating cells, wherein the bit clock refers to a clock signal which is K times faster than the symbol clock.

Figure 4:
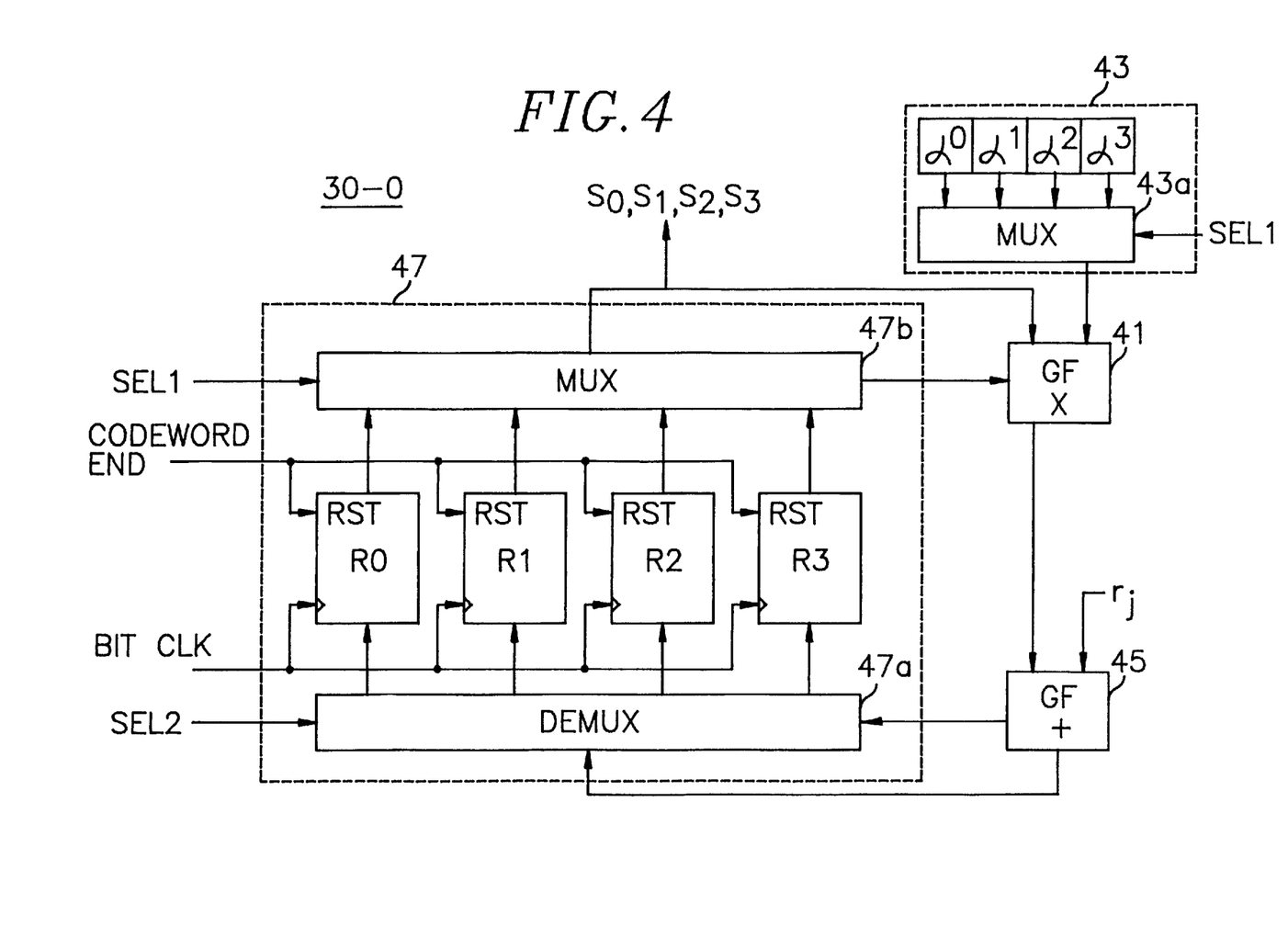
FIG. 4 offers a schematic diagram of a syndrome calculating cell in accordance with a first embodiment of the present invention.

Referring to FIG. 4, there is shown a diagram of a syndrome calculating cell 30-0 which calculates 0th to 3rd syndromes ($S_0$ to $S_3$) in accordance with a first embodiment of the present invention.

The syndrome calculating cell 30-0 includes a multiplier 41 operating on the finite field $GF(2^m)$ and an adder 45 operating on the finite field $GF(2^m)$ which directly correspond to the adder 25 and the multiplier 21 shown in FIG. 2, respectively. It further includes a root input block 43 and a register block 47 which correspond to the memory 23 and the register 27 shown in FIG. 2, respectively. The functions of the corresponding blocks are similar except that blocks of FIG. 4 perform K times as many jobs as those of FIG. 2 by using the bit clock. To support this, the register block 47 is constructed to include 4 registers (R0 to R3) connected in parallel. A multiplexor ("MUX") 47b and a demultiplexor ("DEMUX") 47a are also included in the register block 47 to control the input and output of the registers. Edge triggered D flip-flops may be used as the registers.

At the syndrome calculating cell 30-0, the calculation of Eq. (3) for 4 roots of the code generating polynomial ($\alpha^0$ to $\alpha^3$) is done iteratively from the innermost parenthesis.

The received symbols (a first symbol $r_{N-1}$ to an Nth symbol $r_0$ in that order, N being a positive integer) are provided to the adder 45 one by one, one symbol per symbol clock cycle.

4 intermediate values are stored at the four separate registers R0 to R3 included in the register block 47, one value at one register, wherein each intermediate value refers to a result of an iteration in the course of calculating Eq. (3B), e.g., ($r_{N-l}\alpha^i + r_{N-2}$). From now on, Lth set of intermediate values refers to 2T intermediate values calculated by using first L received symbols ($r_{N-1}$ to $r_{N-L}$), i.e., [. . . ($r_{N-1}\alpha^i + r_{N-2}$)$\alpha^i$+. . . +$r_{N-(L-1)}$]$r_{N-L}$, i being 0 to 2T–1; and an Mth intermediate value of the Lth set refers to [. . . ($r_{N-1}\alpha^M + r_{N-2}$)$\alpha^m$+. . . +$r_{N-(L-1)}$]$r_{N-L}$. Specifically, an intermediate value obtained in the course of calculating $S_0$ is stored in $R_0$, and so on. Before a first received symbol, $r_{N-1}$, of a current codeword is inputted, the registers R0 to R3 are initialized to an initial intermediate value 0. Specifically, the registers are initialized in response to a codeword end signal (CODEWORD END) which notifies the end of a previous codeword.

During a first symbol clock cycle, initial intermediate values, i.e., 0's, provided from R0 to R3 are fed through the MUX 47b to the GF multiplier 41 in response to a first selection signal SEL1. 0th to 3rd roots of the code generating polynomial are stored at 4 memory cells included in the root input block 43 and provided therefrom to the multiplier 41 through a MUX 43a included in the root input block 43. At the multiplier 41, the initial intermediate values 0's are sequentially multiplied with $\alpha^0$ to $\alpha^3$, respectively, one multiplication at each bit clock cycle, to thereby provide 4 multiplication results, i.e., 0's to the adder 45. Meanwhile, the first received symbol, $r_{N-1}$, is fed to the GF adder 45 wherein it is added to each of the initial intermediate values. Then the results, i.e., $r_{N-1}$'s, are coupled through the DEMUX 47a to registers R0 to R3, to be stored therein.

To do this, the MUX 43a included in the root input block, in response to SEL1, selects each of the 4 roots periodically ($\alpha^0$, $\alpha^1$, $\alpha^2$, $\alpha^3$, $\alpha^0$, $\alpha^1$, $\alpha^2$, . . . ), one root per a bit clock cycle, and provides it to the multiplier 41 with a period of one symbol clock cycle or 4 bit clock cycles. Similarly, the MUX 47b selects one of the 4 registers and provides the content of the selected register to the GF multiplier 41 periodically. The DEMUX 47a directs the input thereto to one of the 4 registers periodically one for each bit clock cycle in response to a second selection signal SEL2.

Specifically, during the first bit clock cycle of the first symbol clock cycle, the initial intermediate value 0 provided from R0 is multiplied with $\alpha^0$ at the multiplier 41 and the multiplication result 0 is added to $r_{N-1}$ at the adder 45, to provide a first intermediate value of a first set, i.e., $r_{N-1}$, back to R0 through the DEMUX 47a. At the rising edge of the second bit clock cycle, the intermediate value obtained in the first bit clock cycle, i.e., $r_{N-1}$, is clocked into $R_0$. By repeating the above procedure 4 times, the intermediate values $r_{N-1}$'s are stored in the 4 registers R0 to R3.

During a second symbol clock cycle, the intermediate values, i.e., $r_{N-1}$'s, stored at R0 to R3 is fed through the MUX 47b to the multiplier 41. At the multiplier 41, the intermediate values from R0 to R3 are sequentially multiplied with $\alpha^0$ to $\alpha^3$, respectively, one multiplication at each bit clock cycle, to thereby provide multiplication results, $r_{N-1}\alpha^i$'s, i being 0 to 3, to the adder 45. At the adder 45, $r_{N-1}\alpha^i$'s are sequentially added to a second received symbol $r_{N-2}$ which is provided thereto during the second symbol clock cycle.

Specifically, during a first bit clock cycle of the second symbol clock cycle, the first intermediate value of the first set provided from $R_0$, i.e., $r_{N-1}$, is multiplied with $\alpha^0$ at the multiplier 41 and the output thereof is added to $r_{N-2}$ at the adder 45, to provide a first intermediate value of a second set, $r_{N-1}\alpha^0 + r_{N-2}$, back to R0, to be stored therein. By repeating the above procedure 4 times, 4 intermediate values of the second set, $r_{N-1}\alpha^i + r_{N-2}$'s, i being 0 to 3, are stored in the 4 registers R0 to R3. In doing this, the DEMUX 47a distributes the 0th to 3rd intermediate values of the second set ($r_{N-1}\alpha^0 + r_{N-2}$ to $r_{N-1}\alpha^3 + r_{N-2}$) to the corresponding registers (R0 to R3) in response to the second selection signal (SEL2).

By repeating the procedure explained above, calculation of Eq. (3) is completed in N symbol clock cycles. After an Nth symbol clock cycle finishes, syndromes $S_0$, $S_1$, $S_2$, $S_3$ are stored at the corresponding registers. (That is, $S_0$ in $R_0$, $S_1$ in R1, and so on.) After the Nth symbol clock cycle, the syndromes may be provided sequentially through the MUX 47b by using the first selection signal SEl1, to be stored in other part of Reed-Solomon decoder and used in correcting errors residing in the received symbols. The syndromes may be provided in a parallel manner directly from output ports of the registers included in the register block 47 without going through the MUX 47b. The manner of provision of the syndromes depends upon the need of the overall system in which the syndrome calculating device is employed. After the syndromes are provided, the registers are initialized to 0 in response to the codeword end signal for the processing of a next codeword.

The contents of the registers R0 to R3 for each bit clock cycle of the first and the second symbol clock cycles are shown in Table 1, wherein each row corresponds to each bit clock cycle.

TABLE 1

| symbol clock | R0 | R1 | R2 | R3 |
|---|---|---|---|---|
| 1st | 0 | 0 | 0 | 0 |
|  | $r_{N-1}$ | 0 | 0 | 0 |
|  | $r_{N-1}$ | $r_{N-1}$ | 0 | 0 |
|  | $r_{N-1}$ | $r_{N-1}$ | $r_{N-1}$ | 0 |
| 2nd | $r_{N-1}$ | $r_{N-1}$ | $r_{N-1}$ | $r_{N-1}$ |
|  | $r_{N-1}\alpha^0 + r_{N-2}$ | $r_{N-1}$ | $r_{N-1}$ | $r_{N-1}$ |
|  | $r_{N-1}\alpha^0 + r_{N-2}$ | $r_{N-1}\alpha^1 + r_{N-2}$ | $r_{N-1}$ | $r_{N-1}$ |
|  | $r_{N-1}\alpha^0 + r_{N-2}$ | $r_{N-1}\alpha^1 + r_{N-2}$ | $r_{N-1}\alpha^2 + r_{N-2}$ | $r_{N-1}$ |

Figure 5:
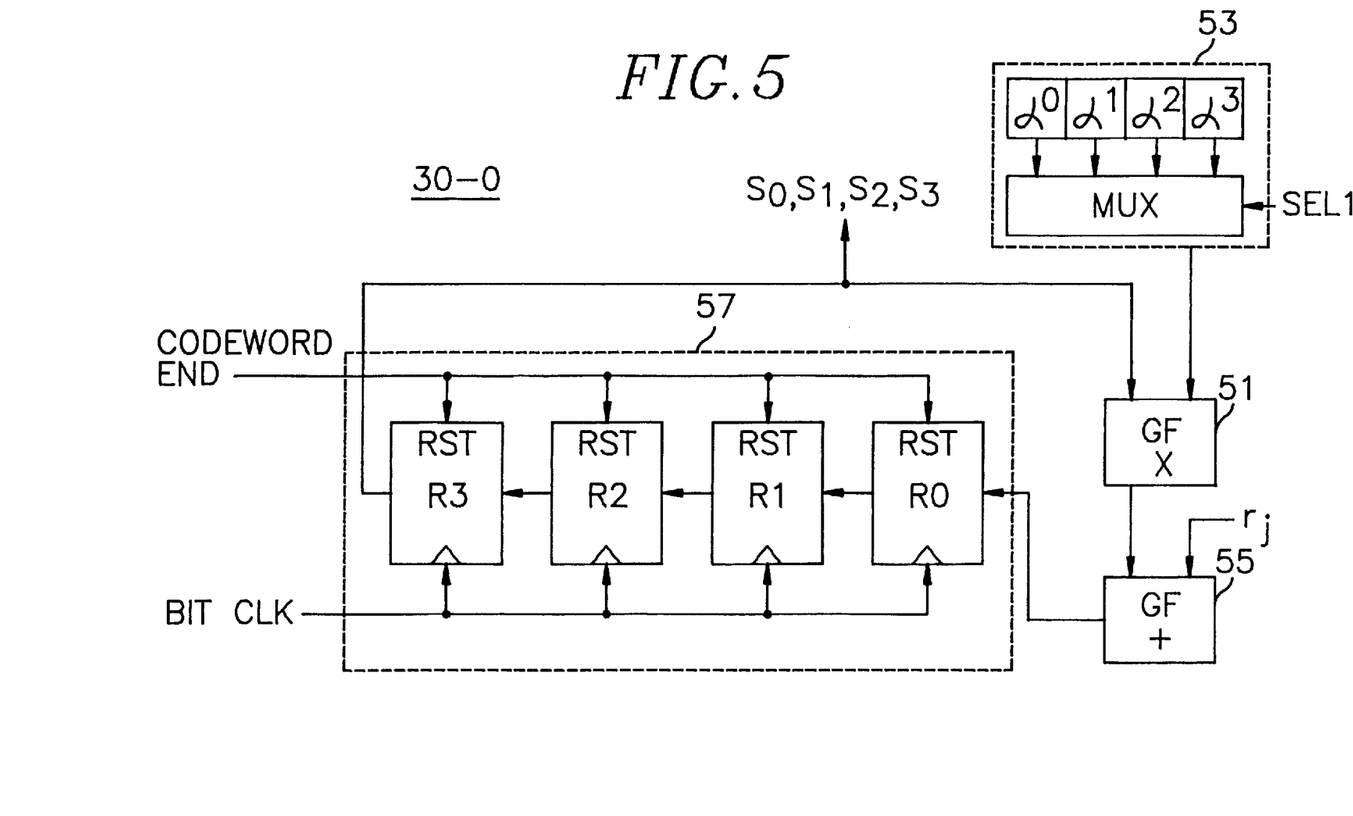
FIG. 5 depicts a schematic diagram of a syndrome calculating cell in accordance with a second embodiment of the present invention.

Referring to FIG. 5, there is shown a structure of a syndrome calculating cell 30-0 which calculates $S_0$ to $S_3$ in accordance with a second embodiment of the present invention.

In accordance with the second embodiment, the syndrome calculating cell 30-0 includes a multiplier 51 operating on the finite field GF($2^m$), a root input block 53, an adder 55 operating on the finite field GF($2^m$), and a register block 57 which directly correspond to those shown in FIG. 4. The difference between the cells shown in FIGS. 4 and 5 is that while the register block 47 shown in FIG. 4 includes 4 registers which are connected in parallel to the multiplexor and the demultiplexor, the register block 57 includes only 4 registers which are connected serially. Except the register block, the corresponding blocks are essentially identical to those of the first embodiment shown in FIG. 4.

In the first embodiment shown in FIG. 4, each of the intermediate values is stored at its corresponding register with the help of the DEMUX 47a and the MUX 47b. However, in the second embodiment, each of the intermediate values is first fed to R0 and stored therein for a bit clock cycle. The contents of R0 is then shifted to R1 and stored therein for a next bit clock cycle, and then to R2, and then to R3. The output of R3 is coupled to the multiplier 51. As a result, the overall function of the register block 57, i.e., a storage device with one symbol clock delay, is the same as that of the first embodiment shown in FIG. 4. The difference is that while in the first embodiment an intermediate value is stored through the demultiplexor in one register for a symbol clock cycle before it is fed through the multiplexor to the GF multiplier, in the second embodiment it is stored in each of the registers sequentially for a bit clock cycle before it is fed to the multiplier 51.

Except the internal operation of the register block 57, the syndrome calculating cell shown in FIG. 5 operates essentially the same way as that of FIG. 4.

TABLE 2

| symbol clock | R0 | R1 | R2 | R3 |
|---|---|---|---|---|
| 1st | 0 | 0 | 0 | 0 |
|  | $r_{N-1}$ | 0 | 0 | 0 |
|  | $r_{N-1}$ | $r_{N-1}$ | 0 | 0 |
|  | $r_{N-1}$ | $r_{N-1}$ | $r_{N-1}$ | 0 |
| 2nd | $r_{N-1}$ | $r_{N-1}$ | $r_{N-1}$ | $r_{N-1}$ |
|  | $r_{N-1}\alpha^0 + r_{N-2}$ | $r_{N-1}$ | $r_{N-1}$ | $r_{N-1}$ |
|  | $r_{N-1}\alpha^1 + r_{N-2}$ | $r_{N-1}\alpha^0 + r_{N-2}$ | $r_{N-1}$ | $r_{N-1}$ |
|  | $r_{N-1}\alpha^2 + r_{N-2}$ | $r_{N-1}\alpha^1 + r_{N-2}$ | $r_{N-1}\alpha^0 + r_{N-2}$ | $r_{N-1}$ |

To explain the difference between the register blocks 47 and 57, the contents of the registers R0 to R3 included in the register block 57, for each bit clock cycle of the first and the second symbol clock cycles are shown in Table 2, wherein each row corresponds to each bit clock cycle.

Figure 6:
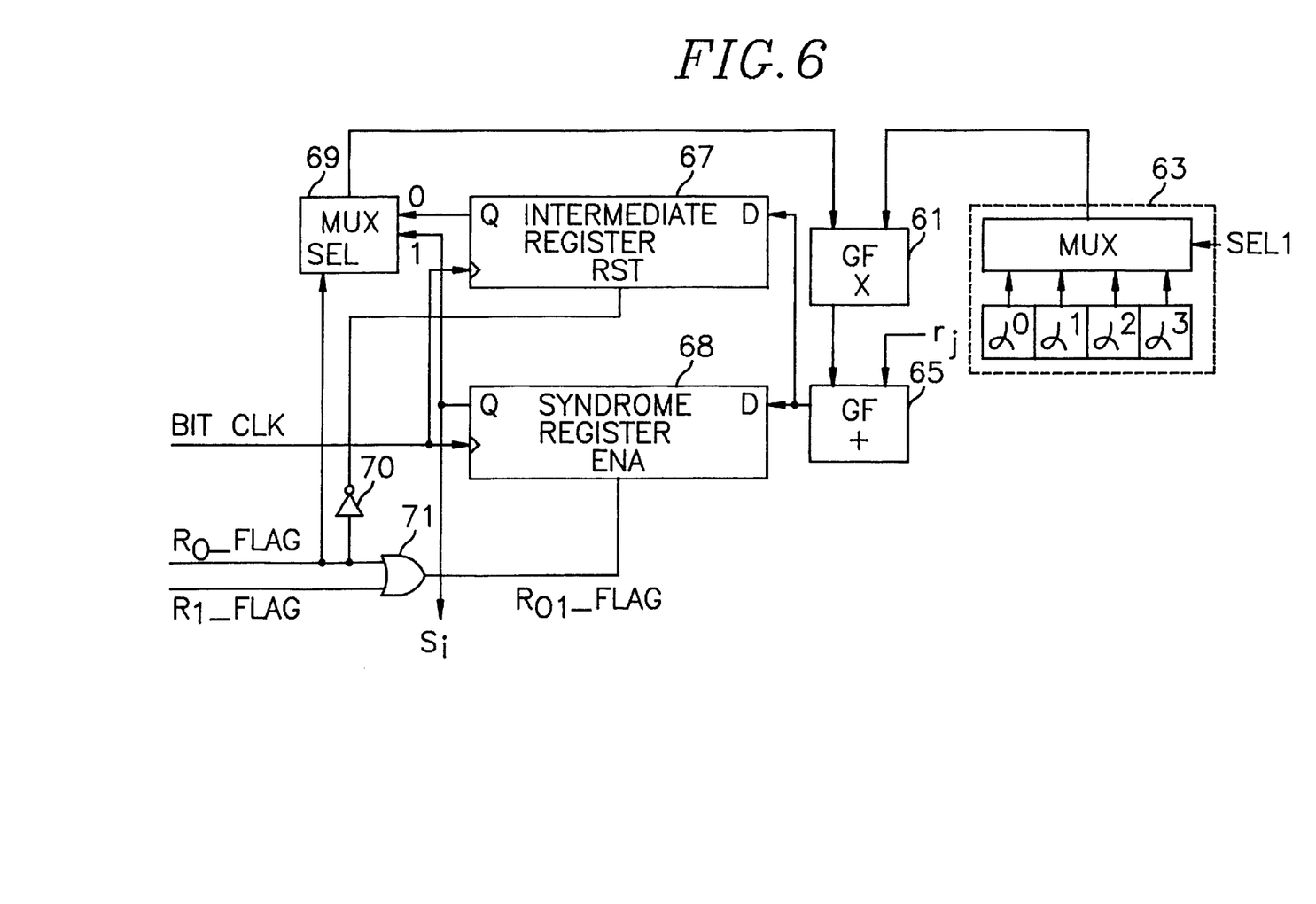
FIG. 6 describes a schematic diagram of a syndrome calculating cell in accordance with a third embodiment of the present invention.

Referring now to FIG. 6, there is shown a schematic diagram of a syndrome calculating cell 30-0 which calculates $S_0$ to $S_3$ in accordance with a third embodiment of the present invention.

The syndrome calculating cell 30-0 shown in FIG. 6 includes a multiplier 61 operating on the finite field, a root input block 63, and an adder 65 operating on the finite field which are identical to those shown in FIG. 5. However, while the syndrome calculating cell shown in FIG. 5 includes only one register block 57, the cell shown in FIG. 6 includes 2 register blocks, i.e., an intermediate register block 67 and a syndrome register block 68. The syndrome calculating cell shown in FIG. 6 also includes a multiplexor ("MUX") 69, an inverter 70 and an OR gate 71, which are used in controlling the two register blocks 67 and 68. Except the register blocks, the operation of the corresponding blocks are essentially identical to those of the second embodiment.

Internal structure of both of the register blocks 67 and 68 may be the same as that of the register block 47 or 57 shown in FIG. 4 or 5, respectively. The intermediate register block 67 stores the intermediate values and provides them through the MUX 69 to the GF multiplier 61 during first to (N−1)st symbol clock cycles. Meanwhile, the syndrome register block 68 stores the intermediate values obtained during the (N−1)st symbol clock cycle and provide them to the MUX 69 during the Nth symbol clock cycle. The syndrome register block 68 also stores the syndromes obtained during the Nth symbol clock cycle.

To do this, two signals $r_0$_FLAG and $r_1$_FLAG are used to control the two register blocks. Specifically, $r_0$_FLAG and $r_1$_FLAG are signals which notify that an Nth symbol $r_0$ and an (N−1)st symbol $r_1$ are being received, respectively. In this embodiment, $r_0$_FLAG ($r_1$_flag) is a signal whose value is 1 during the Nth ((N−1)st) symbol clock cycle and is 0 during the rest of the clock cycles. Accordingly, an output of the OR gate 71, $r_{01}$_FLAG, is 1 during the (N−1)st and the Nth symbol clock cycles and is 0 during the 1st to (N−2)nd symbol clock cycles.

In FIG. 6, inverted $r_0$_FLAG provided from the inverter 70 is connected to reset ports of the registers included in the intermediate register block 67. Therefore, during the 1st to (N−1)st clock cycles, the intermediate register block 67 functions identically to the register block 57 shown in FIG. 5. During the Nth clock cycles, the intermediate register block is reset in response to $r_0$_FLAG and the output thereof is invalid. In response to $r_0$_FLAG inputted thereto on an input port SEL, the MUX 69 selects an input on port 0, i.e., an output from the intermediate register block 67 during the 1st to (N−1)st clock cycles and selects an input on port 1, i.e., an output from the syndrome register block 68 during the Nth clock cycle, and provides it to the multiplier 61.

Meanwhile, $r_{01}$_FLAG is connected to enable ports of the registers included in the syndrome register block 68, so that the registers included in the syndrome register block 68 are enabled during the (N−1)st and Nth symbol clock cycles. Therefore, the syndrome register block 68 starts to receive the intermediate values from the adder 65 at the start of (N−1)st symbol clock cycle. By the start of the Nth symbol clock cycle, an (N−1)st set of intermediate values obtained during the (N−1)st symbol clock cycle, [... ($r_{N-1}\alpha^i+r_{N-2}$)$\alpha^i+ ... r_2]\alpha^i+r_1$, are fully fed into the syndrome register block 68. Therefore, during Nth symbol clock cycle, intermediate values of the (N−1)st set are sequentially fed from the syndrome register block 68 through the MUX 69 to the multiplier 61, to be used in determining syndromes. It should be noted that during the (N−1)st symbol clock cycle, both of the two register blocks perform the input and output operations. Accordingly, during the (N−1)st symbol clock cycle, an (N−2)nd set of intermediate values are provided from the intermediate register block 67 to the multiplier 61, to be used in determining an (N−1)st set of intermediate values which are fed to the syndrome register block 68.

As explained above, the syndrome calculating cell of the present invention provides K syndromes simultaneously by using the bit clock which is K times faster than the symbol clock, to thereby reduce the number of the syndrome calculating cells down to 1/K. K is not limited to 4 but can be any positive plural number. If one symbol clock cycle equals 8 bit clock cycles, the root input block stores 8 roots, the register block includes 8 registers, and the number of syndrome calculating cells becomes (2T)/8. Therefore, the number of the adders and multipliers can be reduced a factor of by 1/8.

To support this, the multiplier on the finite field should be fast enough. Therefore, the number of bit clock cycles corresponding to one symbol clock cycle is determined considering the capability of the multiplier.

9

While the present invention has been described with respect to the particular embodiments, it will be apparent to those skilled in the art that various changes and modifications may be made without departing from the spirit and scope of the invention as defined in the following claims.

What is claimed is:

1. An apparatus, for use in a Reed-Solomon decoder which decodes a codeword containing N received symbols, N being a positive integer, for calculating syndromes $S_i$'s iteratively in N iterations, according to:

$$S_i = [\ldots [(r_{N-1}\alpha^i + r_{N-2})\alpha^i + r_{N-3}]\alpha^i + \ldots + r_1\alpha^i] + r_0$$

wherein i is an integer ranging from 0 to 2T−1, T being a predetermined number, $r_{N-j}$ represents a jth received symbol which is fed in synchronization with a symbol clock, j being 1 to N, and $\alpha^i$ denotes an ith root of a code generating polynomial, the apparatus comprising L syndrome calculating cells each of which provides K syndromes, each of K and L being a positive integer not larger than 2T, each syndrome calculating cell including:

storage means containing a first set of K memory means, wherein the storage means sequentially provides contents of the first set of K memory means during each iteration and is initialized to 0 prior to a first iteration;

first input means for sequentially providing K consecutive roots of the code generating polynomial during each iteration;

a multiplier of a finite field $GF(2^m)$ for sequentially multiplying the K roots of the code generating polynomial provided from the first input means with the contents of the first set of K memory means provided from the storage means, to thereby provide K multiplication results during each iteration; and an adder on the finite field $GF(2^m)$ for adding the jth received symbol $r_{N-j}$ to each of the K multiplication results during each iteration, to thereby provide the K intermediate values to the storage means during a (j1)th iteration, j1 being 1 to (N−1), or provide the K syndromes to the storage means during an Nth iteration.

2. The apparatus of claim 1, wherein the first set of K memory means contained in the storage means are connected serially to form a first-in first-out structure.

3. The apparatus of claim 1, wherein T is 8, L is 2 and K is 8.

4. The apparatus of claim 1, wherein each iteration corresponds to one symbol clock cycle and the K memory means of the first set are D flip-flops which are operated by using a bit clock which is K times faster than the symbol clock.

5. An apparatus, for use in a Reed-Solomon decoder which decodes a codeword containing N received symbols, N being a positive integer, for calculating syndromes $S_i$'s iteratively in N iterations, according to:

$$S_i = [\ldots [(r_{N-1}\alpha^i + r_{N-2})\alpha^i + r_{N-3}]\alpha^i + \ldots + r_1\alpha^i] + r_0$$

wherein i is an integer ranging from 0 to 2T−1T being a predetermined number, $r_{N-j}$ represents a jth received symbol which is fed in synchronization with a symbol clock, j being 1 to N, and $\alpha^i$ denotes an ith root of a code generating polynomial, the apparatus comprising L syndrome calculating cells each of which provides K syndromes, each of K and L being a positive integer not larger than 2T, each syndrome calculating cell including:

storage means containing a first set of K memory means, wherein the storage means sequentially provides contents of the first set of K memory means during each iteration and is initialized to 0 prior to a first iteration;

first input means for sequentially providing K roots of the code generating polynomial during each iteration;

a multiplier of a finite field $GF(2^m)$ for sequentially multiplying the K roots of the code generating polynomial provided from the first input means with the contents of the first set of K memory means provided from the storage means, to thereby provide K multiplication results during each iteration; and an adder on the finite field $GF(2^m)$ for adding the jth received symbol $r_{N-j}$ to each of the K multiplication results during each iteration, to thereby provide the K intermediate values to the storage means during a (j1)th iteration, j1 being 1 to (N−1), or provide the K syndromes to the storage means during an Nth iteration, wherein the storage means further contains:

means for providing each of the K intermediate values of the K syndromes provided from the adder to each of the first set of K memory means to be stored therein; and converting means for sequentially providing the contents of the first set of K memory means.

6. The apparatus of claim 5, wherein each iteration corresponds to one symbol clock cycle and the K memory means of the first set are D flip-flops which are operated by using a bit clock which is K times faster than the symbol clock.

7. The apparatus of claim 6, wherein the first set of K memory means contained in the storage means is connected serially to form a first-in first-out structure.

8. The apparatus of claim 6, wherein T is 8, L is 2 and K is 8.

9. The apparatus of claim 5, wherein the first set of K memory means contained in the storage means is connected serially to form a first-in first-out structure.

10. The apparatus of claim 5, wherein T is 8, L is 2 and K is 8.

11. An apparatus, for use in a Reed-Solomon decoder which decodes a codeword containing N received symbols, N being a positive integer, for calculating syndromes $S_i$'s iteratively in N iterations, according to:

$$S_i = [\ldots [(r_{N-1}\alpha^i + r_{N-2})\alpha^i + r_{N-3}]\alpha^i + \ldots + r_1\alpha^i] + r_0$$

wherein i is an integer ranging from 0 to 2T−1, T being a predetermined number, $r_{N-j}$ represents a jth received symbol which is fed in synchronization with a symbol clock, j being 1 to N, and $\alpha^i$ denotes an ith root of a code generating polynomial, the apparatus comprising L syndrome calculating cells each of which provides K syndromes, each of K and L being a positive integer not larger than 2T, each syndrome calculating cell including:

storage means containing a first set of K memory means, wherein the storage means sequentially provides contents of the first set of K memory means during each iteration and is initialized to 0 prior to a first iteration;

first input means for sequentially providing K roots of the code generating polynomial during each iteration;

a multiplier of a finite field $GF(2^m)$ for sequentially multiplying the K roots of the code generating polynomial provided from the first input means with the contents of the first set of K memory means provided from the storage means, to thereby provide K multiplication results during each iteration; and an adder on the finite field $GF(2^m)$ for adding the jth received symbol $r_{N-j}$ to each of the K multiplication results during each iteration, to thereby provide the K intermediate values to the storage means during a (j1)th iteration, j1 being 1 to (N−1). or provide the K syndromes to the storage means during an Nth iteration, wherein the first input means contains:

a memory for storing the K roots of the code generating polynomial; and a selection means for sequentially providing the K roots of the code generating polynomial stored at the memory during each iteration.

12. The apparatus of claim 11, wherein the first set of K memory means contained in the storage means is connected serially to form a first-in first-out structure.

13. The apparatus of claim 11, wherein T is 8, L is 2 and K is 8.

14. An apparatus, for use in a Reed-Solomon decoder which decodes a codeword containing N received symbols, N being a positive integer, for calculating syndromes $S_i$'s iteratively in N iterations, according to $$S_i=\{\ldots[(r_{N-1}\alpha^i+r_{N-2})\alpha^i+r_{N-3}]\alpha^i+\ldots+r_1\}\alpha^i+r_0$$

wherein i is an integer ranging from 0 to 2T−1, T being a predetermined number, $r_{N-j}$ represents a jth received symbol which is fed in synchronization with a symbol clock, j being 1 to N, and $\alpha^i$ denotes an ith root of a code generating polynomial, the apparatus comprising L syndrome calculating cells each of which provides K syndromes, each of L and K being a positive integer not larger than 2T, each syndrome calculating cell including:

first storage means containing a first set of K memory means, wherein the first storage means sequentially provides contents of the first set of K memory means during each iteration, and the first set of K memory means is initialized to 0 prior to a first iteration;

second storage means containing a second set of K memory means, wherein the second storage means sequentially provides contents of the second set of K memory means during each iteration;

first selection means for sequentially providing the contents of the first set of K memory means provided from the first storage means during a (j1)th iteration, j1 being an integer ranging from 1 to (N−1), and sequentially providing the contents of the second set of K memory means provided from the second storage means during an Nth iteration;

first input means for sequentially providing K roots of the code generating polynomial during each iteration;

a multiplier on a finite field $GF(2^m)$ for sequentially multiplying the K roots of the code generating polynomial provided from the first input means with the contents of the first or second set of K memory means provided from the first selection means, to thereby provide K multiplication results during each iteration; and an adder on the finite field $GF(2^m)$ for adding the jth received symbol $r_{N-j}$ to each of the K multiplication results during a jth iteration, to thereby provide the K intermediate values to the first and the second storage means during the (j1)th iteration, j1 being 1 to (N−1), and provide the K syndromes to the first and the second storage means during the Nth iteration.

15. The apparatus of claim 14, wherein each of the first and the second storage means further contains:

means for providing each of the K intermediate values or the K syndromes provided from the adder to each of the K memory means to be stored therein; and converting means for sequentially providing the contents of the K memory means.

16. The apparatus of claim 14, wherein each iteration corresponds to one symbol clock cycle and the K memory means of the first set and the second set are D flip-flops which are operated by using a bit clock which is K times faster than the symbol clock.

17. The apparatus of claim 14, wherein the K memory means of the first set and the second set, respectively, are connected serially to form a first-in first-out structure.

18. The apparatus of claim 14, wherein the first input means contains:

a memory for storing the K roots of the code generating polynomial; and second selection means for sequentially providing the K roots of the code generating polynomial stored at the memory during each iteration.

19. The apparatus of claim 14, wherein the first set of K memory means is reset during the Nth symbol clock cycle and the second set of K memory means is enabled during the (N−1)st and the Nth symbol clock cycles.

20. The apparatus of claim 14, wherein T is 8, L is 2 and K is 8.

* * * * *